United States Patent
Speckbacher et al.

(10) Patent No.: US 9,677,874 B2
(45) Date of Patent: Jun. 13, 2017

(54) POSITION-MEASURING DEVICE

(71) Applicant: DR. JOHANNES HEIDENHAIN GmbH, Traunreut (DE)

(72) Inventors: Peter Speckbacher, Kirchweidach (DE); Tobias Gruendl, Hausham (DE); Josef Weidmann, Feichten a.d. Alz (DE); Andrew Graham, Chieming (DE); Daniela Bayer, Nussdorf (DE)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 0 days.

(21) Appl. No.: 15/005,079

(22) Filed: Jan. 25, 2016

(65) Prior Publication Data
US 2016/0216103 A1    Jul. 28, 2016

(30) Foreign Application Priority Data
Jan. 26, 2015 (DE) .................... 10 2015 201 230

(51) Int. Cl.
*G01B 11/14* (2006.01)
*G01D 5/34* (2006.01)
(Continued)

(52) U.S. Cl.
CPC ............... *G01B 11/14* (2013.01); *G01D 5/34* (2013.01); *G01D 5/34707* (2013.01);
(Continued)

(58) Field of Classification Search
CPC .......... G01B 11/14; G01B 5/008; G01D 5/34; G01D 5/34707; G01D 5/34715; G01D 5/34746; G01N 21/956
(Continued)

(56) References Cited

U.S. PATENT DOCUMENTS 5,510,230 A * 4/1996 Tennant ................. B82Y 10/00
250/492.2
5,786,931 A * 7/1998 Speckbacher ........ G02B 5/1857
359/566
(Continued)

FOREIGN PATENT DOCUMENTS

EP    0610833 A1    8/1994
EP    0849567 B1    6/1998
(Continued)

*Primary Examiner* — Hina F Ayub
(74) *Attorney, Agent, or Firm* — Leydig, Voit & Mayer, Ltd.

(57) ABSTRACT

A position-measuring device includes a first scale and a second scale, which are arranged end-to-end to extend across a measurement range, as well as a scanning unit having a light source configured to emit a light beam. The first scale includes a reflective phase grating having first periodic marks which diffract an incident light beam into a predetermined diffraction order with a first diffraction efficiency. The second scale includes a reflective phase grating having second periodic marks that differ in shape from the first periodic marks. A reflectivity of the phase grating of the second scale is reduced compared to a reflectivity of the phase grating of the first scale to such an extent that the phase grating of the second scale diffracts the incident light beam into the predetermined diffraction order with the first diffraction efficiency.

13 Claims, 3 Drawing Sheets

(51) Int. Cl.
　　　*G01D 5/347*　　　(2006.01)
　　　*G01B 5/008*　　　(2006.01)
(52) U.S. Cl.
　　　CPC ......... *G01B 5/008* (2013.01); *G01D 5/34715* (2013.01); *G01D 5/34746* (2013.01)
(58) Field of Classification Search
　　　USPC ....................................................... 356/614
　　　See application file for complete search history.

(56) References Cited

U.S. PATENT DOCUMENTS

| | | | |
|---|---|---|---|
| 5,880,882 A | | 3/1999 | Michel et al. |
| 6,115,153 A | * | 9/2000 | Tomita ............... G01D 5/34707 |
| | | | 250/237 G |
| 6,445,456 B2 | | 9/2002 | Speckbacher et al. |
| 6,476,405 B1 | | 11/2002 | Henshaw |
| 7,129,475 B2 | | 10/2006 | Kanno et al. |
| 2006/0227309 A1 | | 10/2006 | Loopstra et al. |
| 2008/0297809 A1 | * | 12/2008 | Holzapfel .............. G01D 5/266 |
| | | | 356/614 |
| 2009/0200631 A1 | * | 8/2009 | Tai ..................... H01L 27/1462 |
| | | | 257/435 |
| 2012/0162646 A1 | * | 6/2012 | Holzapfel ................ G01D 5/38 |
| | | | 356/369 |
| 2013/0038804 A1 | * | 2/2013 | Li ......................... G02B 5/1814 |
| | | | 349/33 |
| 2013/0112860 A1 | | 5/2013 | Mizuno |
| 2015/0076332 A1 | * | 3/2015 | Nagura .................. G01B 11/14 |
| | | | 250/231.13 |

FOREIGN PATENT DOCUMENTS

| | | |
|---|---|---|
| EP | 1106972 A1 | 6/2001 |
| EP | 1557701 B1 | 7/2005 |
| EP | 1762897 A1 | 3/2007 |
| EP | 2051047 A1 | 4/2009 |
| EP | 2395328 A2 | 12/2011 |
| EP | 2511669 A2 | 10/2012 |

\* cited by examiner

POSITION-MEASURING DEVICE

CROSS-REFERENCE TO PRIOR APPLICATION

Priority is claimed to German Patent Application No. DE 10 2015 201 230.1, filed on Jan. 26, 2015, the entire disclosure of which is hereby incorporated by reference herein.

FIELD

The present invention relates to a position-measuring device for position measurement in at least one direction.

A position-measuring device of this kind is used for measuring changes in the position of two objects that are movable relative to one another. In the process, a scale is scanned by a light beam, and the light beam modulated at the scale as a function of position is directed to a scanning unit, which derives therefrom a measure of the instantaneous position of the scanning unit relative to the scale.

In order to measure relatively large lengths, a plurality of scales are arranged end-to-end, and the plurality of scales are successively scanned by the scanning unit. Such an arrangement is present in particular when using the position-measuring device in lithographic systems since, firstly, the measuring steps attainable are to become ever smaller and, due to the increasing size of the wafers, the required measurement paths are becoming increasingly longer. Due to the higher accuracy requirements of new lithographic systems and the trend toward larger wafers, the measurement paths are required to have an ever-increasing positional accuracy and length.

BACKGROUND

The prior-art European Patent Application EP 1 762 897 A1 shows, in a lithographic system, a position-measuring device having a plurality of scales which are arranged end-to-end to extend the measurement range. Each of the plurality of scales has a reflective phase grating. The scales are disposed on a support (metrology frame) in a manner that enables continuous position measurement across the junction of two scales. The scanning unit is adapted to enable continuous position measurement across the junction. In European Patent Application EP 1 762 897 A1, the scales are referred to as "grid plates" and are adapted for position measurement in two directions that are orthogonal to each other.

It is known that the diffraction efficiency of a reflective phase grating may be affected by many parameters.

The relative diffraction efficiency is affected by the shape of the phase steps. Parameters for the shape are the profile of the phase steps, in particular the flank angle, and the outer contour of the reflective surfaces of the phase steps.

It is known from European Patent EP 0 849 567 B1 that the diffraction efficiency of a reflective phase grating can be optimized by suitably selecting the profile of the phase steps. By suitable selection of the flank angle, it is possible to optimize the relative diffraction efficiency.

European Patent Application EP 1106972 A1 shows that the outer contour of the marks of a phase grating of a scale may be rectangular, with the reflective rectangles being arranged two-dimensionally in a checkerboard pattern with the corners adjacent to each other. It is also generally pointed out that the marks may alternatively also be circular ring-shaped.

SUMMARY

In an embodiment, the present invention provides a position-measuring device including at least one first scale and at least one second scale, which are arranged end-to-end to form an enlarged measurement range, as well as a scanning unit having a light source configured to emit a light beam. The first scale includes a reflective phase grating having first periodic marks which diffract an incident light beam into a predetermined diffraction order with a first diffraction efficiency. The second scale includes a reflective phase grating having second periodic marks that differ in shape from the first periodic marks. A reflectivity of the phase grating of the second scale is reduced compared to a reflectivity of the phase grating of the first scale to such an extent that the phase grating of the second scale diffracts the incident light beam into the predetermined diffraction order with the first diffraction efficiency.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
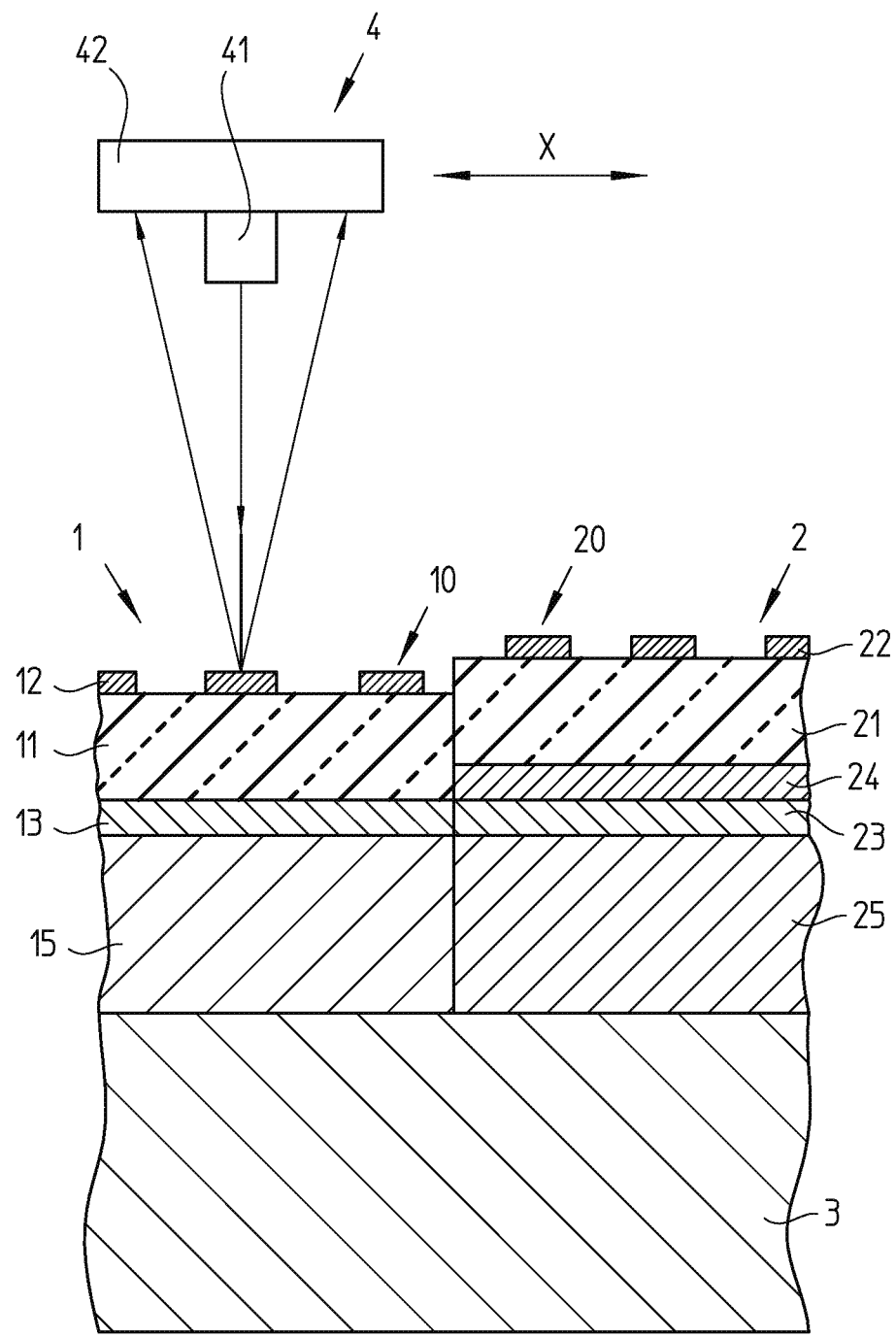
FIG. 1 is a cross-sectional view of a position-measuring device according to an embodiment of the present invention.

In an embodiment, the present invention provides a position-measuring device which permits precise position measurement over a large measurement range.

A distinction is made between the absolute diffraction efficiency of a reflective phase grating, often just called "diffraction efficiency," and the relative diffraction efficiency.

One important parameter for the diffraction efficiency of a reflective phase grating of a scale is the shape of the phase steps. In this connection, the term "shape" refers to the shape of the height profile of a phase step and the outer contour of the reflective surface of the phase steps of the phase grating.

Another important parameter is the reflectivity of the phase grating, which is dependent on the reflectivity of the reflectors used.

Both parameters, shape and reflectivity, determine the diffraction efficiency of a phase grating, which is also called absolute diffraction efficiency. The diffraction efficiency of a phase grating is the ratio of the intensity of a light beam diffracted into a particular solid angle (diffraction order) to the intensity of a light beam of a particular wavelength that is incident on the phase grating.

When only the geometric shape of the phase steps is considered (the outer geometric contour and the profile of the phase steps, in particular the flank angle) and an identical reflectivity of the materials is used as a reference, then one speaks of relative diffraction efficiency.

As demonstrated by the prior art mentioned at the outset, the shape of the phase grating been continuously optimized to increase the relative diffraction efficiency. Now, new optimized scales, which have a higher diffraction efficiency than the scales used heretofore, are available for many applications. Many scale manufacturers have switched over to producing the optimized scales that feature phase gratings of optimized shape.

A problem arises if one of the plurality of scales in an existing position-measuring device needs to be replaced. Due to the higher relative diffraction efficiency of the new scale, which is achieved by the optimized shape of the phase grating, the scanning signal obtained when scanning the new scale is greater than that obtained when scanning the older scales, which may result in problems during further evaluation of the scanning signal.

An embodiment of the present invention allows a scale having a phase grating of optimized shape; i.e., one having a high relative diffraction efficiency, to be used as a replacement for a scale of the position-measuring device, the replacement scale being adapted to the diffraction efficiency of the remaining scales in that its reflectivity is reduced.

In this connection, "reflectivity" means the ratio of the reflected intensity to the incident intensity of a light beam, regardless of the shape of the phase grating.

In accordance with an embodiment of the present invention, the position-measuring device has at least one first scale and at least one second scale, which are arranged end-to-end to extend the measurement range. Moreover, the position-measuring device includes a scanning unit having a light source for emitting a light beam. The first scale includes a reflective phase grating having first periodic marks which diffract an incident light beam into a predetermined diffraction order with a first diffraction efficiency. The second scale includes a reflective phase grating having second periodic marks that differ in shape from the first periodic marks. The diffraction efficiency of a predetermined diffraction order of the second scale is adapted to the diffraction efficiency of the first scale in that the reflectivity of the phase grating of the second scale is reduced compared to the reflectivity of the phase grating of the first scale.

Due to the optimized, and thus different, shape of the marks of the second scale, the relative diffraction efficiency of the second scale is higher than the relative diffraction efficiency of the first scale.

FIG. 1 schematically illustrates the essential elements of the position-measuring device. This position-measuring device includes at least one first scale 1 and at least one second scale 2, which are arranged end-to-end to extend the measurement range in at least one measurement direction X. Scales 1, 2 are arranged end-to-end because a scale 1, 2 of high resolution and accuracy can only be produced in limited size due to physical constraints. Position measurement in the nanometer or sub-nanometer range is required in particular in lithographic systems. To this end, scales 1, 2 have periodic marks 10, 20 smaller than 10 µm. Marks 10, 20 are phase steps having a particular shape; i.e., having a particular profile shape and a particular outer contour of the upper reflective surface. The upper reflective surface, together with the respective lower reflector 13, 23 and the respective spacer layer 11, 21, constitutes the phase grating. The end-to-end arrangement of a plurality of scales 1, 2 in measurement direction X enables continuous position measurement across the junction of two scales 1, 2. It is particularly advantageous if scales 1, 2 are abutted against one another in the same plane. Moreover, scales 1, 2 are disposed on a common support 3, which is also called "metrology frame."

For photoelectric scanning of scales 1, 2, a scanning unit 4 is provided, which includes a light source 41 for emitting a light beam that strikes one of the two scales 1, 2, where it is diffracted. Scanning unit 4 further includes a receiver unit 42 for receiving the diffracted light beam. In FIG. 1, receiver unit 42 is shown only schematically for measurement direction X.

First periodic marks 10 of first scale 1, together with reflectors 12, 13 and spacer layer 11, constitute the phase grating which diffracts the incident light beam into a predetermined diffraction order with a first diffraction efficiency.

Second scale 2 forms a reflective phase grating having the second periodic marks 20, which differ in shape from the first periodic marks 10 in such a way that the relative diffraction efficiency of second scale 2 is higher than the relative diffraction efficiency of first scale 1.

The material used as a substrate 15 for the first phase grating and as a substrate 25 for the second phase grating is preferably a material having a small thermal expansion coefficient, in particular, glass, glass-ceramic or alumina-ceramic material (cordierite). Such materials are also known by the names ZERODUR, ULE and NEXCERA.

The reflectivity of second scale 2 is reduced compared to the reflectivity of first scale 1 to such an extent that second scale 2 diffracts the incident light beam into the predetermined diffraction order with the same diffraction efficiency as first scale 1. Thus, the diffraction efficiency of second scale 2 is adapted to the level of diffraction efficiency of first scale 1.

If the shape of marks 20 of second scale 2 is optimized as compared to first scale 1, then it is required that the reflectivity of second scale 2 be reduced by 5% to 20% compared to first scale 1.

Advantageously, the phase grating of first scale 1 and the phase grating of second scale 2 are each adapted to suppress the zeroth diffraction order. The first diffraction order is the one to be analyzed and, therefore, is the predetermined diffraction order.

The phase grating of first scale 1 and the phase grating of second scale 2 each have a layer stack composed of a transparent spacer layer 11, 21 and two reflectors 12, 13, 22, 23 configured on both sides of the respective spacer layer 11, 21; the reflector 12 of first scale 1 that faces scanning unit 4 forming the first periodic marks 10, and the reflector 22 of second scale 2 that faces scanning unit 4 forming the second periodic marks 20.

Transparent spacer layers 11, 21 are each preferably composed of a dielectric material, such as, for example, $SiO_2$, $TiO_2$, $Ta_2O_5$, and constitutes the phase shifter for the predetermined diffraction order.

In accordance with the present invention, when a scale 1 needs to be replaced in a position-measuring device containing a plurality of first scales 1, then a second scale 2 is installed whose relative diffraction efficiency is higher compared to the remaining first scales 1, but whose (absolute) diffraction efficiency is adapted to the diffraction efficiency of first scales 1.

It has proven to be particularly advantageous if the reflectivity of second scale 2 is reduced in that the layer pack which is composed of spacer layer 21 and reflector 22 and which produces the phase deviation is taken unchanged from first scale 1. In this connection, the term "taken unchanged"

refers to material and thickness. It has been found that the reflectivity of reflector 23 under spacer layer 21 of second scale 2 is particularly suitable as the parameter to be adapted.

Advantageously, the reflectivity of second scale 2 is selected to be less than the reflectivity of first scale 1 in that the reflectivity of reflector 23 under spacer layer 21 of second scale 2 is selected to be less than the reflectivity of reflector 13 under spacer layer 11 of first scale 1. The reflectivity can be adapted by suitably selecting the material or modifying the surface of reflector 23.

It has been found to be particularly advantageous if the reflectivity of second scale 2 is reduced compared to first scale 1 by an attenuating layer 24 disposed between spacer layer 21 and the reflector 23 that is located under spacer layer 21 of second scale 2. This advantageously allows adopting the proven design of first scale 1, including the proven phase deviation properties. What is required for the process is merely that attenuating layer 24 be incorporated between reflected 23 and spacer layer 21 of second scale 2 in order to reduce the reflectivity.

Attenuating layer 24 is a partially transparent layer, in particular a thin metal layer including, for example, chromium, nickel, titanium, or silicon, and having a thickness of a few nm, in particular in the range from 3 nm to 15 nm.

The present invention is particularly suitable for use in a position-measuring device which is adapted for position measurement in two directions X, Y that are orthogonal to each other. In this case, first scale 1 and second scale 2 are configured for position measurement in the two orthogonal directions X, Y, respectively, in that first marks 10 and second marks 20 are arranged periodically and perpendicular to one another.

Figure 2:
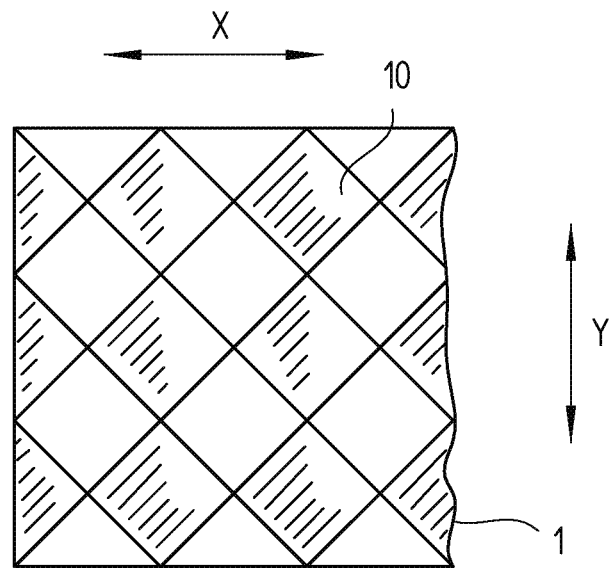
FIG. 2 is a plan view of the first scale of the position-measuring device of FIG. 1.

FIG. 2 shows an exemplary embodiment of first scale 1 in top view. First periodic marks 10 have a rectangular outer contour.

Figure 3:
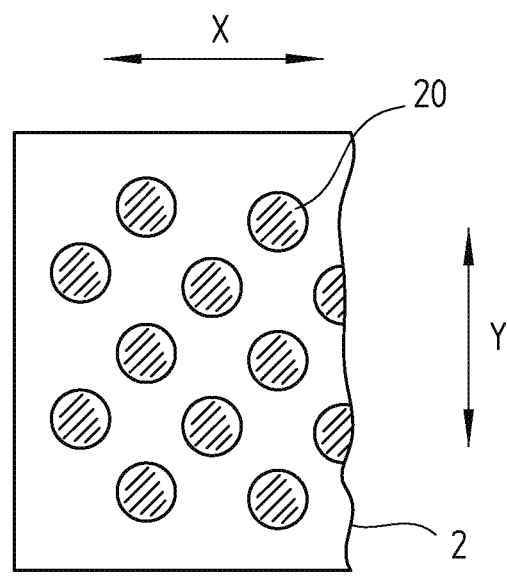
FIG. 3 is a plan view of the second scale of the position-measuring device of FIG. 1.

FIG. 3 shows an exemplary embodiment of a second scale 2. Second periodic marks 20 have a circular outer contour. The outer contour may also form an ellipse, or the outer contour of marks 20 of second scale 2 is composed of curves or of curves and straight lines.

Figure 4:
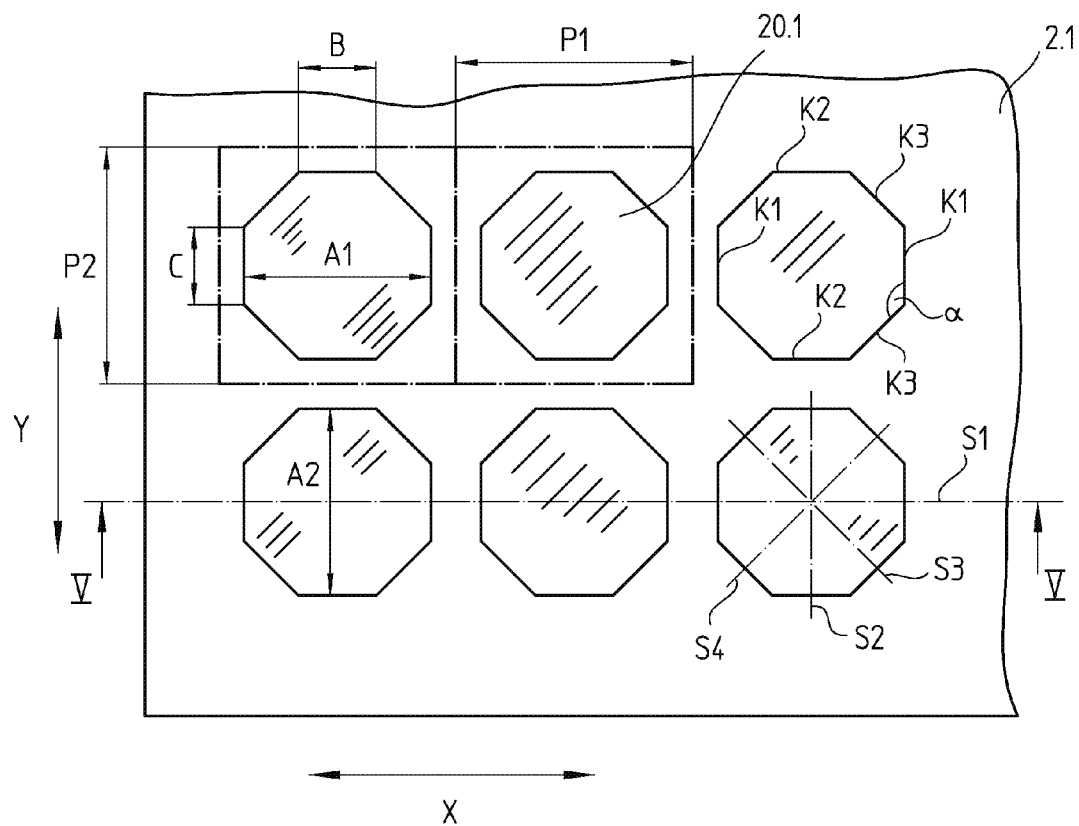
FIG. 4 is a plan view of another exemplary embodiment of the second scale.
Figure 5:
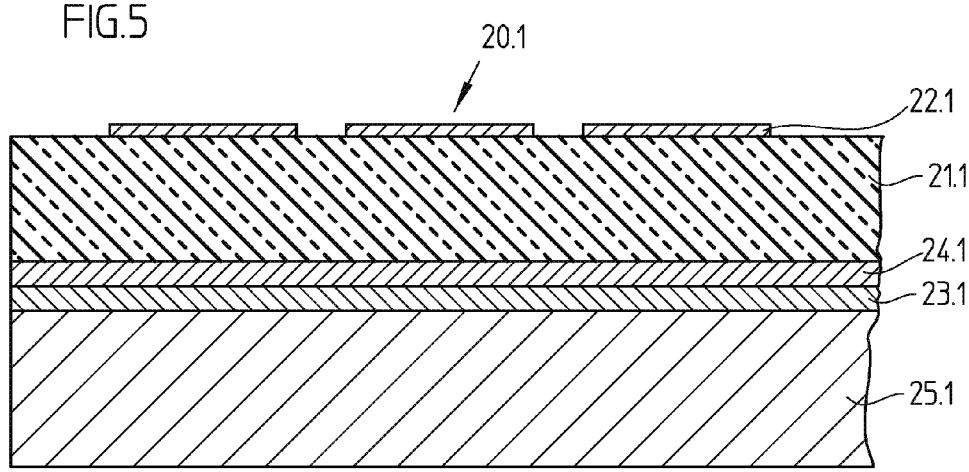
FIG. 5 is a cross-sectional view of the second scale taken along line V-V of FIG. 4.

FIGS. 4 and 5 illustrate a further possible embodiment of a second scale 2.1 for position measurement in first direction X and in second direction Y extending orthogonal thereto. Scale 2.1 includes a phase grating having a periodic array of reflective marks 20.1 in first direction X and in second direction Y.

Marks 20.1 each have an outer contour that is formed by a continuous line which includes two mutually opposing first straight edges K1 and two mutually opposing second straight edges K2 extending perpendicularly thereto, as well as connecting lines K3 between first edges K1 and second edges K2, respectively, that form an obtuse angle α, respectively.

Connecting lines K3 advantageously include straight lines. Obtuse angle α between first edge K1 and straight connecting line K3, as well as between second edge K2 and straight connecting line K3 is, in particular, 135° in each case.

Moreover, mutual spacing A1 of first edges K1 is equal to mutual spacing A2 of second edges K2.

An especially advantageous embodiment is a four-axis symmetrical outer contour. In this case, the outer contour is:

mirror-symmetrical to a first axis of symmetry S1 that extends orthogonally to the first edges K1, and mirror-symmetrical to a second axis of symmetry S2 that extends orthogonally to second edges K2, and mirror-symmetrical to a third axis of symmetry S3 that extends at 45° to first axis of symmetry S1, and mirror-symmetrical to a fourth axis of symmetry S4 that extends orthogonally to third axis of symmetry S3.

This embodiment has the advantage that the diffraction properties of marks 20.1 are identical in both directions X and Y, and, for that reason, the scanning units may be identically configured for both directions X and Y. For one thing, the same spatial conditions are obtained for both directions X and Y; this means that, relative to the X-Y plane, the angles of the diffraction orders to be analyzed are identical, and the diffraction orders to be analyzed are also equal in intensity, so that identical evaluation units can be used for both directions X and Y.

These advantageous conditions are obtained, in particular, when first edges K1 are oriented parallel to a direction Y of the two directions X, Y, and second edges K2 are oriented parallel to the other direction X of the two directions X, Y, or when first edges K1 are angled 45° toward first direction X, and second edges K2 are angled 45° toward second direction Y.

The phase grating is designed to suppress the zeroth diffraction order as completely as possible. Marks 20.1 are arranged with periodicity P1 in first direction X and with periodicity P2 in second direction Y. To provide a precise and high-resolution position measurement, the periodicities P1 and P2 are advantageously smaller than 10 µm. In addition, P1 is, in particular, equal to P2.

It is advantageous when length B of second edges K2 is 10% to 90% of mutual spacing A1 of first edges K1, respectively, and thus, ratio B/A1 is selected to be between 0.1 and 0.9. This ratio also holds for the first edges K1, so that length C of first edges K1 is 10% to 90% of mutual spacing A2 of second edges K2, respectively, and thus, ratio C/A2 is likewise between 0.1 and 0.9.

An even better optimization is achieved when length B of second edges K2 is 30% to 70% of mutual spacing A1 of first edges K1, respectively, and thus, ratio B/A1 is selected to be between 0.3 and 0.7; as well as length C of first edges K1 is 30% to 70% of mutual spacing A2 of second edges K2, respectively, and thus, ratio C/A2 is selected to be between 0.3 and 0.7.

FIG. 5 is a cross-sectional view of scale 2.1 taken along line V-V of FIG. 4.

The scale 2.1 so configured has an extremely high relative diffraction efficiency. In order to enable a scale 2.1 so configured to be used as a replacement in an existing system of scales, the reflectivity of the scale 2.1 is reduced in accordance with the present invention. In particular, this reduction is achieved in such a way that the layer pack producing the phase deviation remains unchanged. This is accomplished by providing an attenuating layer 24.1 between lower reflector 23.1 and transparent spacer layer 21.1. This attenuating layer 24.1 is a partially transparent layer which attenuates the reflection of an incident light beam, in particular by between 5% and 20%.

It applies to all exemplary embodiments that reflectors 12, 13, 22, 23, 22.1, 23.1 may be thin layers and that they may contain the following materials: chromium, gold, copper, titanium, nickel, aluminum, silver or silicon. A glass, glass-ceramic or alumina-ceramic material having an expansion coefficient of nearly zero, in particular, ZERODUR, NEXCERA or ULE, is preferably used as a substrate 15, 25, 25.1.

Dielectric materials such as, in particular, $SiO_2$, $TiO_2$, $Ta_2O_5$ are suitable as a transparent spacer layer 11, 21, 21.1.

The present invention has been described using examples where the increased relative diffraction efficiency of the phase grating of second scale 2, 2.1, as compared to the phase grating of first scale 1, is achieved by the shape of the outer contour of marks 20, 20.1. The relative diffraction efficiency of the second phase grating can also be increased by optimizing the profile shape of the phase steps, in particular, the flank angle. In this regard, reference is made to European Patents EP 0 849 567 B1 and EP1 557 701 B1. Here, too, the present invention can be used successfully.

In FIG. 1, the scanning beam path is shown only schematically. The position-measuring device designed in accordance with the present invention may preferably also be configured such that the light beam is modulated as a function of position by repeated diffraction at scale 1, 2, 2.1.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A position-measuring device, comprising:
    at least one first scale and at least one second scale, which are arranged end-to-end to form an enlarged measurement range; and
    a scanning unit having a light source configured to emit a light beam,
    wherein the first scale includes a reflective phase grating having first periodic marks which diffract an incident light beam into a predetermined diffraction order with a first diffraction efficiency, and
    wherein the second scale includes a reflective phase grating having second periodic marks that differ in shape from the first periodic marks, a reflectivity of the phase grating of the second scale being reduced compared to a reflectivity of the phase grating of the first scale to such an extent that the phase grating of the second scale diffracts the incident light beam into the predetermined diffraction order with the first diffraction efficiency.

2. The position-measuring device as recited in claim 1, wherein the reflectivity of the phase grating of the second scale is reduced by 5% to 20% compared to the reflectivity of the phase grating of the first scale.

3. The position-measuring device as recited in claim 1, wherein the phase grating of the first scale and the phase grating of the second scale are each adapted to suppress the zeroth diffraction order.

4. The position-measuring device as recited in claim 1, wherein the predetermined diffraction order is the first diffraction order.

5. The position-measuring device as recited in claim 1, wherein the first scale and the second scale each have a layer stack comprising a transparent spacer layer disposed between two reflectors, a first one of the reflectors of the first scale that faces the scanning unit forming the first periodic marks, and a first one of the reflectors of the second scale that faces the scanning unit forming the second periodic marks.

6. The position-measuring device as recited in claim 5, wherein the transparent spacer layer is composed of a dielectric material.

7. The position-measuring device as recited in claim 5, wherein the reflectivity of the phase grating of the second scale is reduced compared to the reflectivity of the phase grating of the first scale in that a reflectivity of a second one of the reflectors of the second scale that is disposed under the spacer layer of the second scale is less than a reflectivity of a second one of the reflectors of the first scale that is disposed under the spacer layer of the first scale.

8. The position-measuring device as recited in claim 5, wherein the reflectivity of the phase grating of the second scale is reduced compared to reflectivity of the phase grating of the first scale by an attenuating layer that is disposed between the spacer layer and a second one of the reflectors of the reflectors of the second scale that is disposed under the spacer layer of the second scale.

9. The position-measuring device as recited in claim 8, wherein the attenuating layer has a thickness that is in a range of 3 nm to 15 nm.

10. The position-measuring device as recited in claim 1, wherein the first scale and second scale are configured for position measurement in two orthogonal directions, respectively, in that the first marks and the second marks are arranged periodically in directions that are orthogonal to each other.

11. The position-measuring device as recited in claim 1, wherein the first periodic marks have an outer contour that differs from an outer contour of the second periodic marks.

12. The position-measuring device as recited in claim 11, wherein the first periodic marks have a rectangular outer contour.

13. The position-measuring device as recited in claim 11, wherein the second periodic marks each have:
    an octagonal outer contour;
    a circular outer contour;
    an outer contour composed of curves;
    an outer contour composed of curves or of curves and straight lines; or
    an outer contour that is formed by a continuous line which includes two mutually opposing first straight edges and two mutually opposing second straight edges extending perpendicularly thereto, as well as connecting lines extending between the first edges and the second edges, respectively, that form an obtuse angle therewith, respectively.

* * * * *